(12) United States Patent
Salman et al.

(10) Patent No.: US 8,018,002 B2
(45) Date of Patent: Sep. 13, 2011

(54) FIELD EFFECT RESISTOR FOR ESD PROTECTION

(75) Inventors: Akram A. Salman, Plano, TX (US); Stephen G. Beebe, Los Altos Hills, CA (US); Shuqing Cao, Palo Alto, CA (US)

(73) Assignee: GlobalFoundries Inc., Grand Cayman (KY)

( * ) Notice: Subject to any disclaimer, the term of this patent is extended or adjusted under 35 U.S.C. 154(b) by 157 days.

(21) Appl. No.: 12/490,749

(22) Filed: Jun. 24, 2009

(65) Prior Publication Data

US 2010/0328826 A1 Dec. 30, 2010

(51) Int. Cl.
*H01L 23/62* (2006.01)

(52) U.S. Cl. ........ 257/360; 257/355; 257/356; 257/357; 257/358; 257/363; 361/56

(58) Field of Classification Search .................. 257/360, 257/119, 133, 173, 328, 355, 361, 373; 361/56, 361/111
See application file for complete search history.

(56) References Cited

U.S. PATENT DOCUMENTS

| | | | |
|---|---|---|---|
| 4,819,047 A | 4/1989 | Gilfeather et al. | |
| 4,996,626 A | 2/1991 | Say | |
| 5,034,845 A | 7/1991 | Murakami | |
| 5,173,755 A * | 12/1992 | Co et al. | 257/361 |
| 5,239,440 A | 8/1993 | Merrill | |
| 5,359,211 A | 10/1994 | Croft | |
| 5,515,225 A | 5/1996 | Gens et al. | |
| 5,969,391 A * | 10/1999 | Tajima | 257/373 |
| 6,097,071 A | 8/2000 | Krakauer | |
| 6,274,910 B1 * | 8/2001 | Yu | 257/355 |
| 6,320,232 B1 * | 11/2001 | Gossner et al. | 257/360 |
| 6,521,952 B1 * | 2/2003 | Ker et al. | 257/360 |
| 6,864,537 B1 * | 3/2005 | Mallikarjunaswamy | 257/355 |
| 6,885,529 B2 | 4/2005 | Ker et al. | |
| 2006/0256608 A1 | 11/2006 | Chen et al. | |
| 2007/0007585 A1 | 1/2007 | Sokolik et al. | |
| 2007/0262386 A1 * | 11/2007 | Gossner et al. | 257/355 |
| 2008/0087962 A1 | 4/2008 | Salman et al. | |
| 2010/0171149 A1 * | 7/2010 | Denison et al. | 257/173 |

OTHER PUBLICATIONS

Barth Electronics, Inc., User's Manual, BARTH Model 4012 VFTLP+ Pulse Curve Tracer, revised Sep. 26, 2008.
A. Amerasekera et al., ESD in Silicon Integrated Circuits, ESD Protection Circuit Design Concepts and Strategy, pp. 108-113 and 310-313, Wiley & Sons, Ltd., 2002.
ESD Association, ESD Association Standard Practice for the Protection of Electrostatic Discharge Susceptible Items, Electrostatic Discharge Sensitivity Testing—Very Fast Transmission Line Pulse (VF-TLP)—Component Level, ANSI/ESD SP5.5.2-2007 (Approved Nov. 12, 2007).

(Continued)

*Primary Examiner* — Bradley K Smith
*Assistant Examiner* — Errol Fernandes
(74) *Attorney, Agent, or Firm* — Hamilton & Terrile, LLP; Michael Rocco Cannatti (57) ABSTRACT

An electrostatic discharge protection device and methodology are provided for protecting semiconductor devices against electrostatic discharge events by temporarily forming during normal (non-ESD) operation two more inversion layers (112, 113) in a first well region (104) that is disposed between anode and cathode regions (105, 106) in response to one or more bias voltages (G1, G2) that are close to Vdd in order to reduce leakage current and capacitance during normal operation (non-ESD) condition. During an electrostatic discharge event, the bias voltages can be removed (e.g., decoupled or set to 0V) to eliminate the inversion layers, thereby forming a semiconductor resistor for shunting the ESD current.

13 Claims, 2 Drawing Sheets

OTHER PUBLICATIONS

G. Boselli et al., Analysis of ESD Protection Components in 65nm CMOS Technology: Scaling Perspective and Impact on ESD Design Window, EOS/ESD Symposium, 2005.

C. Duvvury, ESD Qualification Changes for 45nm and Beyond, IEEE Electron Devices Meeting, Dec. 15-27, 2008.

H. Gieser et al., Very Fast Transmission Line Pulsing of Integrated Structures and the Charged Device Model, IEE Transactions on Components, Packaging, and Manufacturing Technology—Part C, vol. 21, No. 4, Oct. 1998.

S. Narasimha et al., High Performance 45-nm SOI Technology with Enhanced Strain, Porous Low-k BEOL, and Immersion Lithography, Int'l Electron Devices Meeting, Dec. 11-13, 2006.

A. Salman et al., Double Well Field Effect Diode: Lateral SCR-like Device for ESD Protection of I/Os in Deep Sub Micron SOI, EOS/ESD Symposium, 2007.

A. Salman et al., Field Effect Diode (FED): A novel device for ESD protection in deep sub-micron SOI technologies, Int'l Electron Devices Meeting, Dec. 11-13, 2006.

S. Voldman et al., CMOS-on-SOI ESD Protection Networks, Electrical Overstress/Electrostatic Discharge Symposium, Sep. 10-12, 1996.

S. Voldman et al., Electrostatic Discharge Protection in Silicon-on-Insulator Technology, IEEE Int'l SOI Conference, Oct. 1999.

SYNOPSYS, Medici Two-Dimensional Device Simulation Program User Manual, version 2002.4, Feb. 2003.

* cited by examiner

FIELD EFFECT RESISTOR FOR ESD PROTECTION

BACKGROUND OF THE INVENTION

1. Field of the Invention

The present invention relates in general to the field of semiconductor devices. In one aspect, the present invention relates to high voltage or electrostatic discharge (ESD) protection devices for integrated input/output circuits.

2. Description of the Related Art

Integrated circuits include various components that can be destroyed by the occurrence of overvoltages, such as electrostatic discharge (ESD) events that can occur at the input/output circuits of an integrated circuit device. To protect against such overvoltages, various ESD protection circuits have been proposed, such as diode-based ESD devices that use a rail-based ESD protection scheme, and ESD devices that use silicon controlled rectifiers (SCR) to provide a local clamping ESD protection scheme. However, these conventional ESD protection schemes fail to provide adequate ESD protection or otherwise impair device performance as the scaling trend of complementary MOSFET (CMOS) technologies continues. For example, the rail-based ESD protection devices do not provide adequate ESD protection because of voltage build-up along the ESD path, and the increase in interconnect resistance in such rail-based ESD designs can cause failures, such as oxide rupture or junction breakdown. On the other hand, while the local clamping ESD schemes reduce the pad voltage and achieve higher protection level under the same stress current, they use special ESD devices with high turn-on voltage (Von) and low leakage current. Local clamping ESD schemes also require two devices to shunt current in both directions, which is the same as the aforementioned rail-based case. As a result, there are limited advantages to be gained in terms of area and overall capacitance with such schemes. With integrated circuits having sub-picofarad capacitive budgets, it becomes increasingly difficult to design an adequate device to shunt the large amount of current in the event of ESD. These design and performance challenges are exacerbated with semiconductor-on-insulator (SOI) ESD devices because of the increased self-heating and lack of vertical ESD structures due to the presence of buried oxide underneath the thin silicon (active) layer. Prior attempts to address these deficiencies include field effect diode and double-well field effect diode designs, but their capacitance savings have not been fully realized because the same number of devices are needed as in the rail-based design due to the need for current shunting in both directions (I/O pad to power supply bus and vice versa).

Accordingly, a need exists for an improved protection device, methodology and system for integrated circuits which prevents damage caused by electrostatic discharge and addresses various problems in the art that have been discovered by the above-named inventors where various limitations and disadvantages of conventional solutions and technologies will become apparent to one of skill in the art after reviewing the remainder of the present application with reference to the drawings and detailed description which follow, though it should be understood that this description of the related art section is not intended to serve as an admission that the described subject matter is prior art.

SUMMARY OF THE INVENTION

Broadly speaking, a field-effect resistor (FER) is disclosed for providing ESD protection. In selected embodiments, the ESD FER device is implemented between the input/output pad and the Vss pad as a pair of series-connected field effect devices that are turned ON with one or more gate bias voltages to provide high-speed, low capacitance ESD protection in both directions during ESD events. During ESD events, the field effect devices in the ESD FER device are turned OFF (meaning that there is no gate voltage applied and no PNPNP structure present) to eliminate the inversion layers beneath the gates so that ESD current is shunted in either direction (from the I/O pad to the Vss pad or vice versa) across the substrate (e.g., the active silicon substrate layer or region above the buried oxide) resistor formed below the field effect devices, thereby protecting against ESD current surges and preventing charge storage across the I/O device(s) which can translate into high voltages that cause breakdown of the I/O device(s). For ESD discharge events between the I/O pad and the Vdd pad, the ESD FER device can be used to provide a rail-based discharge mechanism to shunt current from the I/O pad to the Vss pad to a diode in parallel with the power clamp (for a Pad-to-Vdd discharge) to the Vdd pad, or from the Vdd pad to the power clamp to Vss to the FER to the I/O Pad (for a Vdd-to-Pad discharge). In selected embodiments, the ESD FER device is fabricated in a p-type semiconductor region of a semiconductor-on-insulator (SOI) layer by forming two spaced apart gate electrode structures over a p-well body between two highly doped P+ anode and cathode regions. During normal operation (e.g., when there is no ESD event occurring), a positive bias voltage is applied to both gates, thereby forming an n-type inversion layer beneath each gate and creating two temporarily n-type regions. As a result, a P-N-P-N-P structure is temporarily formed in the SOI layer so that four P/N junctions are formed in series with the second and fourth P/N junctions being biased oppositely from the first and third P/N junctions, thereby effectively stopping leakage current flow with reduced capacitance, at least until an EDS occurs which causes the anode bias to be higher than the Vdd bias.

In selected example embodiments, an electrostatic discharge protection device and methodology are disclosed wherein a semiconductor substrate (e.g., a silicon-on-insulator layer) has disposed therein a P+ anode region, a P-well device region in series with the P+ anode region, and a P+ cathode region in series with the first P-well device region. In addition, first and second field effect devices, such as gate electrodes, are disposed at least substantially overlying the P-well device region and arranged to create first and second separate n-type inversion layers in the P-well device region only when one or more bias voltages are applied to the first and second field effect devices. In response to an electrostatic discharge event which causes the DC bias voltage(s) to be decoupled from the field effect devices (because on-chip ESD happens when power is off), the P+ anode region, first P-well device region, and P+ cathode region behave as a P+/P/P+ resistor element. However, during normal operation when there is no electrostatic discharge event, the bias voltage(s) applied to the field effect devices create temporary separate n-type inversion layers in the P-well device region which behave as a P/N/P/N/P structure to cut off current flow.

In accordance with other exemplary embodiments, a method for protecting an input of a semiconductor structure from an electrostatic discharge event is provided. In the disclosed methodology, a semiconductor substrate layer is provided that includes a first well region that is disposed between anode and cathode regions and two or more field effect devices over the first well region. For example, the semiconductor substrate may be formed as a silicon layer formed over a buried oxide layer, where the silicon layer includes a P+ anode region, a first p-well device region that is formed in series with the P+ anode region, a P+ cathode region formed in series with the first p-well device region;, and first and second field effect devices formed at least substantially overlying the first p-well region. During normal operation, two more inversion layers may be formed below the two or more field effect devices in the first well region in response to at least a first bias voltage, such as by electrically coupling at least the first bias voltage to the two or more field effect devices in the first well region. However, during an ESD event, the inversion layers are eliminated to thereby shunt ESD current between the anode and cathode regions and across the first well region, such as by decoupling at least the first bias voltage from the two or more field effect devices in the event of an ESD event. To appropriately bias the field effect devices, an RC-triggered sensing circuit may be coupled to the two or more field effect devices to generate at least the first bias voltage for forming the two more inversion layers. In addition, the anode region may be electrically coupled to an input/output pad, and the cathode region may be electrically coupled to a clamping circuit.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

A method and apparatus for are provided for protecting against electrostatic discharge (ESD) events by forming field-effect resistor (FER) ESD device as a pair of series-connected field effect devices that are turned ON with one or more gate bias voltages during normal device operation, effectively forming a temporary PNPN thyristor with low leakage current and reduced capacitance. During an ESD event, the series-connected field effect devices are turned OFF to eliminate the inversion layers beneath the gates, thereby forming a substrate resistor below the field effect devices through which the ESD current is shunted in either direction (I/O pad to power bus and vice versa) to provide high-speed, low capacitance ESD protection in both directions during ESD events.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are shown in block diagram form, rather than in detail, in order to avoid limiting or obscuring the present invention. In addition, selected aspects are depicted with reference to simplified cross sectional drawings of a semiconductor device without including every device feature or geometry in order to avoid limiting or obscuring the present invention. Such descriptions and representations are used by those skilled in the art to describe and convey the substance of their work to others skilled in the art. In addition, although specific example materials are described herein, those skilled in the art will recognize that other materials with similar properties can be substituted without loss of function. It is also noted that, throughout this detailed description, certain materials will be formed and removed to fabricate the semiconductor structure. Where the specific procedures for forming or removing such materials are not detailed below, conventional techniques to one skilled in the art for growing, depositing, removing or otherwise forming such layers at appropriate thicknesses shall be intended. Such details are well known and not considered necessary to teach one skilled in the art of how to make or use the present invention.

Figure 1:
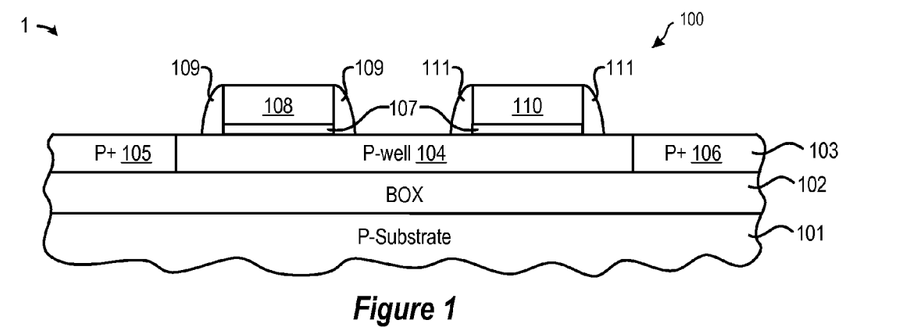
FIG. 1 is a partial cross-sectional view of a semiconductor wafer structure in which a field effect resistor ESD protection device is formed.

Referring now to FIG. 1, there is shown a partial cross-sectional view of a semiconductor wafer structure 1 in which an electrostatic discharge (ESD) protection device 100 is formed in accordance with exemplary embodiments of the present invention where a field effect resistor is formed in a semiconductor-on-insulator (SOI) layer with a pair of series-connected field effect devices that provide protection of a core logic semiconductor circuit, memory circuit or high-speed input/output circuit (not shown) against an ESD event. Specifically, the wafer structure 1 includes a first semiconductor layer 101 formed of a semiconductor material, such as silicon. Depending on the type of device being fabricated, the first semiconductor layer 101 may be implemented as a bulk silicon substrate, single crystalline silicon (doped or undoped), SOI substrate, or any semiconductor material or compound semiconductor material or any combination thereof, and may optionally be formed as the bulk handling wafer. As will be appreciated, the semiconductor layer 101 may be appropriately doped to provided n-type (electron) and p-type (hole) carriers, and in the illustrated example, may be doped as a p-type substrate layer 101.

The depicted wafer structure 1 also includes an insulator layer 102 formed on the first semiconductor layer 101 which will ultimately be used to form the buried oxide (BOX) layer for silicon-on-insulator devices. The insulator layer 102 may be formed with any desired insulator material, such as silicon dioxide, that is deposited, grown or implanted to form an isolation region that electrically isolates the first semiconductor layer 101 from the second semiconductor layer 103. In particular, the second semiconductor layer 103 may be formed on the insulator layer 102 as a thin semiconductor layer 103 (referred to as a semiconductor-on-insulator or SOI layer) by depositing or growing a semiconductor material, such as silicon, to a predetermined thickness, depending on the circuit function being implemented. As depicted in FIG. 1, the SOI layer 103 may be initially formed by depositing a thin layer of silicon having a thickness of about 20-100 nm, and more specifically less than about 80 nm.

After or during formation of the SOI layer 103 on the insulator layer 102, a P-well region 104 in the SOI layer 103 may be doped with suitable p-type carriers. In an example implementation, the P-well region 104 is doped with a p-type dopant (e.g., boron) to a concentration of between approximately $1\times10^{16}$ to $\times10^{19}$ cm$^{-3}$. Because the doping of the P-well region 104 determines the turn-on voltage of ESD protection device 100, the P-well region 104 may be formed with a low threshold voltage (Vt) well doping profile (or LVT well doping profile) in order to ensure that the temporary inversion layers (described below) are maintained until a sufficiently high anode voltage (above Vdd) is reached. As will be appreciated, higher gate voltages (Vg) improve protection performance because a high Vg strengthens the inversion; however, the highest Vg on-chip is Vdd, which is determined by the power supply being implemented on-chip. Similarly, the range for the anode voltage (Vanode) is from 0 to Vdd and anywhere in between. Thus, if Vdd is high, Vanode can be as high as Vdd, but when Vanode reaches a critical voltage, it causes high leakage current flow, which is undesirable during normal operation. Of course, it will be appreciated that the P-well region 104 may be formed with a regular Vt (RVT) doping profile. In any case, the doping concentration of the P-well region 104 is selected to control the turn-on voltage of ESD protection device 100.

As illustrated in FIG. 1, the ESD protection device 100 also includes a P+ anode region 105 and a P+ cathode region 106 which are also formed in the SOI layer 103 so as to be separated from one another by the P-well region 104. The P+ anode and cathode regions 105, 106 are formed to have a doping concentration that is greater than the doping concentration of the P-well region 104, such as by doping the P+ regions 105, 106 with a p-type dopant (e.g., boron) to a concentration of about $5\times10^{20}$ to about $5\times10^{21}$ cm$^{-3}$, depending on the selected process technology. The P+ anode and cathode regions 105, 106 and the P-well region 104 can be fabricated with any desired selective doping, diffusion or implantation process, such as by implanting boron around an implant mask which protects the P-well region 104 from the anode/cathode implantation.

The field effect devices in the ESD protection device 100 are formed over the P-well region 104 as two or more series connected gate electrode structures. To this end, a gate insulator layer 107 is disposed on the SOI layer 103 over at least the P-well region 104 to a predetermined thickness (e.g., 1-10 nm). The gate insulator 107 may be thermally grown dielectric layer (e.g., silicon dioxide), or deposited insulator layer (such as a silicon oxide, silicon nitride, a high dielectric constant insulator (e.g., HfSiO), or the like) that is deposited in a known manner by chemical vapor deposition (CVD), low pressure chemical vapor deposition (LPCVD), semi-atmospheric chemical vapor deposition (SACVD), or plasma enhanced chemical vapor deposition (PECVD). After forming the gate insulator layer 107, one or more gate electrode layers 108, 110 are formed with a conductive material, such as polycrystalline silicon, that is deposited onto the gate insulator layer 107 as an undoped poly layer to a predetermined thickness (e.g., about 50-200 nm, and more specifically about 100 nm) by LPCVD by the hydrogen reduction of silane, and then subsequently doped with implanted impurities to make it conductive. In addition or in the alternative, other electrically conductive gate electrode-forming materials, such as metals and metal silicides, may be deposited. While the gate electrode layers 108, 110 may be formed to have the same materials and properties, it will be appreciated that different materials may be used to form the gate electrode layers 108, 110. For example, the gate electrode layer 108 may be formed with an N-type polysilicon layer while the gate electrode layer 110 is formed with a P-type polysilicon layer.

The deposited gate electrode layer(s) may then be selectively etched to form the gate electrode structures 108, 110. As will be appreciated, the gate electrode structures 108, 110 may be formed using any desired pattern and etching processes, including application and patterning of photoresist to form an etch mask or resist pattern over the intended gate electrodes 108, 110 during a gate etch process. After forming the gate electrode structures 108, 110, one or more sidewall spacers 109, 111 may be formed, respectively, on the sidewalls of the gate electrodes 108, 110. Though not illustrated, it will be appreciated that the sidewall spacers 109, 111 may be used, at least in part, to protect the P-well region 104 from implantation during formation of the P+ anode and cathode regions 105, 106 if the P+ anode and cathode regions 105, 106 are formed after forming the gate electrode structures 108, 110. In any event, the sidewall spacers 109, 111 may be formed with any suitable dielectric material that has an etch characteristic different from that of the gate electrode-forming material of gate electrode 108, 110 when exposed to the same etch chemistry. For example, sidewall spacers 109, 111 may be formed by depositing a dielectric layer of silicon nitride, silicon oxide, or silicon oxynitride, and then anisotropically etching the deposited dielectric layer to leave only the sidewall spacers 109, 111 on the sidewalls of the gate electrodes 108, 110.

Though not illustrated, it will be appreciated that additional processing steps will be used to complete the fabrication of ESD protection device 100 into a functioning device that may be activated and used in an active circuit. As examples, one or more sacrificial oxide formation, stripping, isolation region formation, well region formation, extension implant, halo implant, spacer formation, source/drain implant, heat drive or anneal steps, and polishing steps may be performed, along with conventional backend processing (not depicted), typically including formation of multiple levels of interconnect that are used to connect the transistors in a desired manner to achieve the desired functionality. Thus, the specific sequence of steps used to complete the fabrication of the semiconductor structures may vary, depending on the process and/or design requirements.

Figure 2:
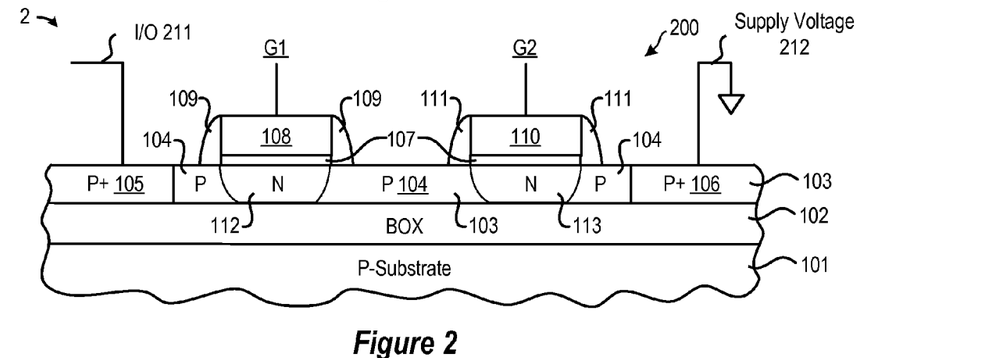
FIG. 2 is a cross-sectional view of an activated field effect resistor ESD protection device in accordance with selected embodiments of the present invention.

Once the processing of the wafer structure is completed and the wafer structure is divided into individual die that are packaged or encapsulated, external leads or pins or conductors are used to supply signals and reference voltages to activate the core semiconductor circuit (not shown) and the ESD protection device 100 via one or more input-output (I/O) bonding pads and reference voltage terminal pads. The connection of the ESD protection device to these external voltages and circuits is illustrated in FIG. 2 with the cross-sectional view of an activated field effect resistor (FER) ESD protection device 200 in accordance with selected embodiments of the present invention. As shown, the FER ESD protection device 200 is activated when a positive bias is applied to both gates 108, 110, thereby inverting the P-well region under each gate to create n-type inversion layers 112, 113 below each gate 108, 110. In addition, the P+ anode region 105 of the FER ESD protection device 200 is connected to the I/O pad 211 (not shown) while the P+ cathode region 106 is connected to the supply voltage 212 (not shown). As shown, the two gates 108, 110 may be biased independently with bias signals G1 and G2, respectively, that are provided by an external circuit, or can be left floating.

In the normal mode of operation when the FER ESD device 200 is activated and there is no ESD event, the ESD protection device 200 includes a P-N-P-N-P structure which acts as four P-N junction diodes connected in series in the silicon layer 103, with the first and third P/N junction diodes biased oppositely from the second and fourth P/N junction diodes. This P-N-P-N-P structure operates similarly to a PNPN thyristor as a bistable switch that conducts current pulses for so long as the voltage across the device is not reversed. With the P-N-P-N-P structure formed by the bias signals G1, G2 in normal operation, leakage current across the P-well region 104 is effectively stopped or reduced from flowing until the anode bias increases above Vdd, and the overall capacitance is reduced. When the bias signals G1, G2 are applied to create n-type inversion layers 112, 113 under the gate electrodes 108, 110, the FER ESD protection device 200 will behave as two forward-biased diodes and two reverse biased diodes in series with a turn-on voltage that is higher than the expected normal operating voltage of the core circuit that is being protected so that the FER ESD protection device 200 effectively appears as an open circuit that is invisible to the core circuit to be protected. In addition, because four diodes are used in series, the series combination has a capacitance lower than that of a single protection diode.

During an ESD event, a sensing or coupling circuit decouples the bias signals G1, G2 from the gates 108, 110, thus restoring the P-well region 104 to its "resistor" state by virtue of eliminating the inversion layers 112, 113. In this state, the FER ESD device 200 behaves as P+/P/P+ resistor so that the ESD current can be driven through the FER ESD device 200. As a result, during an ESD event, the P/N diodes of the FER ESD device 200 disappear so that the FER EDS device 200 serves as a short circuit to short the ESD event to ground and protect the core circuit.

Given this function of the FER ESD device 200 during an ESD event, the doping profile of the P-well region 104 and the length of the P-well region 104 are selected to provide the required amount of resistivity for an ESD event where the combination of the P-well region 104 and the P+ anode and cathode regions 105, 106 (described below) provide a P+/P/P+ resistor element for shunting ESD current. For example, the length of the P-well region 104 may be defined to allow for the length of the well underneath each gate to be 500 nm, and the impurity density of the P-well region 104 is controlled to create N-type inversion layers 112, 113 that reach the buried oxide layer 102 below the gates 108, 110 for the designed gate bias voltages G1, G2 so that a PNPNP structure is maintained to minimize leakage current. As will be appreciated, the application of higher gate bias voltages G1, G2 will prevent the turn-on of the temporary PNPNP structure until the high anode voltage is reached, thereby allowing large currents to be shunted during the ESD discharge events, while minimizing current leakage and power consumption through the FER ESD device during normal operation. For example, by forming the P-well region to have reduced doping levels and applying gate bias voltages G1, G2 within the Vdd range, the induced PNPNP structure is sufficient to keep the FER ESD device 200 in an OFF state. However, a turn-on voltage Von above Vdd can be achieved when the well doping is at or below $10^{17}$ cm$^{-3}$. IN selected embodiments, when the anode voltage 211 is above Vdd, the application of gate bias voltages G1, G2 around Vdd can reduce the capacitance to as low as 0.1 fF/um during normal operation.

As for the current shunting capability of the FER ESD device 200, a tradeoff to take into consideration is between the Von and the resistivity. In order to increase the Von and improve the reduction of leakage current, lower doping should be applied to the well region. But lower doping results in higher resistivity. To keep the ESD clamping voltage below 10V, less than 5 mA/um is achieved using the non-optimized FER. However, the low capacitance value of the structure can alleviate the problem by allowing wider and multi-finger devices to be used. Further optimization techniques can also be applied to improve the device performance. For instance, as the thickness of the SOI layer 103 is reduced, the turn-on voltage Von is increased while increased doping of the P-well layer 104 will reduce the resistivity. In addition, a low-level N-type doping may be applied under the gates 108, 110 to prevent the depletion of electrons in these regions, therefore postponing the turn-on of the PNPNP structure. The length of the FER ESD device 200 may also be shortened to reduce resistance.

Figure 3:
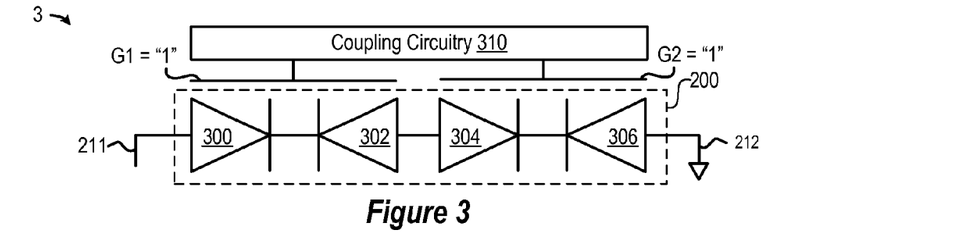
FIG. 3 is a simplified schematic circuit diagram of an activated ESD protection device with a coupling circuit during normal circuit operation.

ESD protection device 200 can be used with a coupling circuitry to control the bias voltages at the gate electrodes 108, 110 based on the presence or absence of an ESD event. For example, FIG. 3 depicts a simplified schematic circuit diagram of an activated ESD protection device 200 with a coupling circuit 310 during normal circuit operation. As depicted, the coupling circuit 310 is electrically coupled to provide the gate bias voltages G1, G2 to the gate electrodes 108, 110 of ESD protection device 200. The coupling circuitry 310 includes sensing circuitry (not shown) which detects an ESD event, such as by detecting a rapid rise time of a signal on an external voltage supply (e.g., Vss or Vdd). Any desired ESD detection scheme may be used in the coupling circuitry 310, including but not limited to RC-triggered sensing circuit schemes and the like. During normal operation when there is no ESD event, the coupling circuitry 310 applies the gate bias voltages G1, G2 to the gate electrodes 108, 110 of the ESD protection device 200. In FIG. 3, the positive gate bias voltage is indicated with a "1" logic level. The applied gate bias voltages G1, G2 invert the surface of the P-well region below the gate electrodes so that the ESD protection device 200 behaves as a plurality of oppositely biased diodes in series, or effectively as an open circuit.

Figure 4:
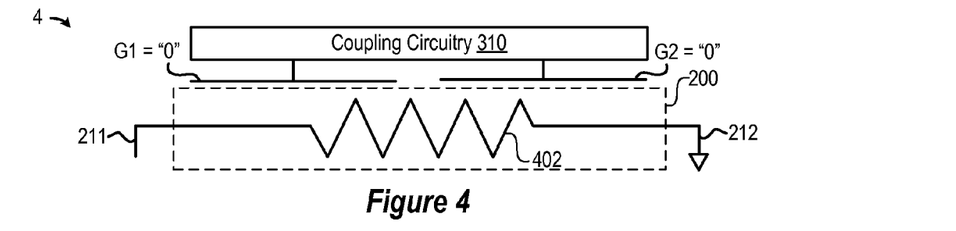
FIG. 4 is a simplified schematic circuit diagram of an activated ESD protection device with a coupling circuit during an ESD event.

Turning now to FIG. 4, there is illustrated a simplified schematic circuit diagram of an activated ESD protection device 200 with the coupling circuit 310 when an ESD event occurs at the external voltage supply (e.g., Vss or Vdd). In this situation, the very short rise time of the ESD event is detected by coupling circuitry 310 which decouples the gate bias voltages G1, G2 from the gate electrodes 108, 110 of the ESD protection device 200. In FIG. 4, the decoupling of the gate bias voltage is indicated with a "0" logic level. As described above, when the gate bias voltages at gate electrodes 108, 110 are decoupled or "low," the FER ESD protection device 200 behaves as a resistor because the inversion layers beneath the gate electrodes 108, 110 have disappeared. As a result, the on-voltage of device 200 is reduced and device 200 effectively appears as a short circuit to short the ESD charge to ground and protecting the core circuit.

Figure 5:
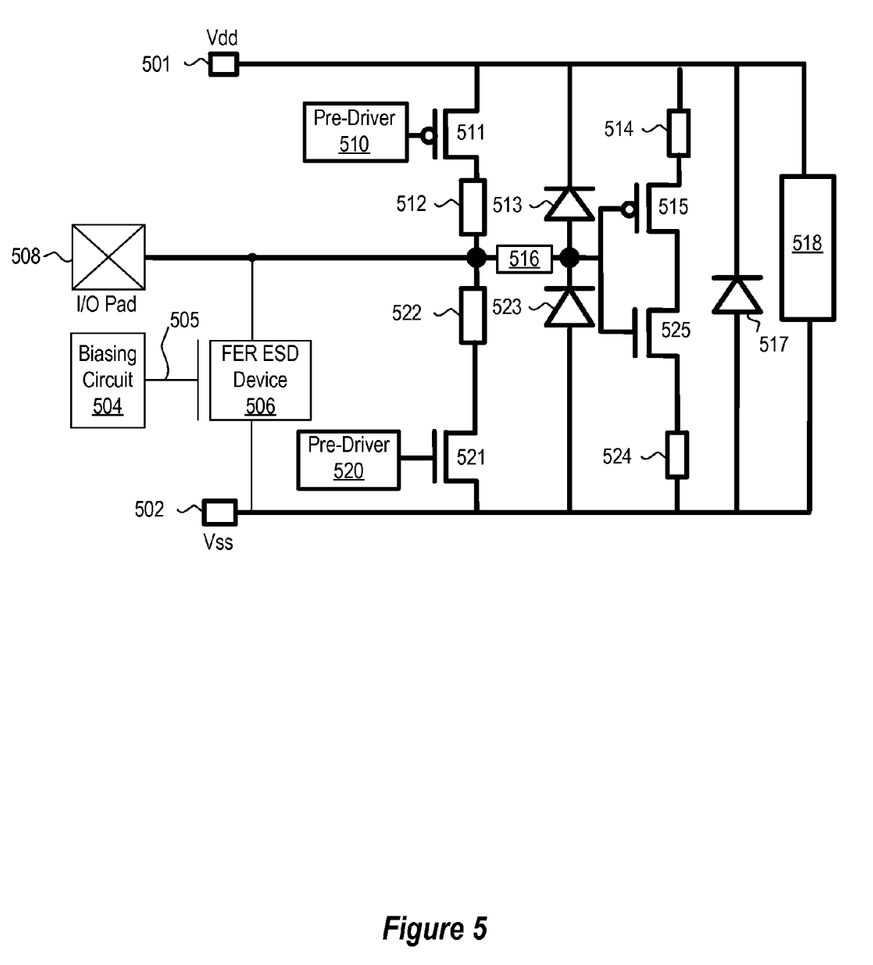
FIG. 5 is a schematic circuit diagram of the ESD protection device used with a high speed input/output pad.

Because of the inherently lower capacitance of FER ESD protection device 200 resulting from the use of the P-N junction diodes in series, the FER ESD protection device 200 can be used with high speed I/O pads. An example implementation is depicted in FIG. 5 with the schematic circuit diagram of the ESD protection device 506 used with a high speed input/output pad 508. As depicted, a single FER ESD protection device 506 is coupled to a high speed I/O pad 508 along with a biasing circuit 504 that ensures that the gates of the FER ESD protection device 506 have a low turn-on voltage under an ESD event. The biasing circuit 504 is coupled to an external voltage supply Vdd (not shown) and generates a DC bias output 505 during non-ESD conditions, but in response to detected ESD events, generates a low voltage (e.g., 0V) or floating bias 505 in order to ensure the FER is in the high-current state. As described herein, the FER ESD protection device 506 includes a first semiconductor layer having a first conductivity type (e.g., p-type), and also includes two or more gate electrode structures formed over the first semiconductor layer to induce two or more inversion layers therein (e.g., n-type inversion layers) in response to the bias voltage(s) 505 provided by the biasing circuit 506. As shown, the FER ESD protection device 506 is coupled between Vss 502 and the I/O pad 508.

During normal operation in the absence of an ESD event, the biasing circuit 504 generates one or more bias voltages 505 which are applied to the gate electrode structure(s) in the FER ESD device 504 to induce the inversion layer(s) therein, thereby forming a PNPNP structure exhibits low capacitance and acts as a short circuit between the Vss 502 and the I/O pad 508. In this configuration, the FER ESD device 504 has a high turn-on voltage, and as long as the voltage at the I/O pad 508 does not rise above the turn-on voltage, the FER ESD device exhibits low leakage and otherwise appears as an open circuit that is transparent to the core circuit.

In contrast, when a positive ESD event occurs at I/O pad 508, the biasing circuit 504 generates one or more bias voltages 505 which are essentially at ground or floating, in which case the gate electrode structure(s) are floating and any inversion layer(s) disappear. In this case, the first semiconductor layer in the FER ESD device 506 acts as a semiconductor resistor without any P-N diode junctions, thereby shorting the ESD current from the I/O pad 508 to Vss or ground 502. The FER ESD protection device 506 works the same way in the reverse direction when a positive ESD event occurs at the Vss or ground terminal 502.

Because of its higher turn-on voltage during normal operation, the FER ESD protection device 506 can also be used for in connection with a power clamping circuit to shunt ESD discharge events between an I/O pad 508 and the Vdd terminal 501 in what is referred to as a "rail-based clamping" scheme. The rail-based clamping circuit configuration is also illustrated in FIG. 5, in accordance with an exemplary embodiment, to show how the FER ESD protection device 506 and a diode device 517 clamp the Vdd terminal 501 to ground. As depicted, the FER ESD protection device 506 is coupled between the I/O pad 508 and ground or Vss, while the diode device 517 is coupled between the Vdd terminal 501 and Vss terminal 502. In addition, an output buffer (which is being protected by the ESD device, diode, and power clamp) is coupled between the Vdd terminal 501 and Vss terminal 502. In the example, the output buffer includes a PMOS transistor 511 with associated pre-driver circuit 510 and load element 512 (coupled between the Vdd terminal 501 and I/O pad 508) and an NMOS transistor 521 with associated pre-driver circuit 520 and load element 522 (coupled between the I/O pad 508 and the Vss terminal 502). An input buffer is also coupled between the Vdd terminal 501 and Vss terminal 502, and includes a series-connected PMOS load element 514, input PMOS transistor 515, input NMOS transistor 525, and NMOS load element 524. The gates of the input PMOS and NMOS transistors 515, 525 are both controlled by a circuit input node that is resistively coupled with the I/O pad 508 by a secondary protection element, the charge-device model (CDM) resistor 516, and that is connected to the Vdd terminal 501 and Vss terminal 502 by the first ESD protection diode device 513 and second ESD protection diode device 523, respectively, which serve as secondary protection diodes for the CDM resistor 516. Finally, a power clamp circuit 518 with power clamp diode 517 are coupled in parallel between the Vdd terminal 501 and Vss terminal 502.

With this example circuit configuration shown in FIG. 5, ESD discharge events between the Vdd terminal 501 and the I/O pad 508 are handled by the FER ESD protection device 506 and power clamp 518 and diode circuitry 513, 523, 517 which protect the core circuitry, such as the input buffer 510-512 and 520-522 and the output buffer 514-515 and 524-525. For example, an ESD event at the Vdd terminal 501 discharges to the I/O pad 508 using a rail-based discharge mechanism to shunt current from the Vdd terminal 501, across the power clamp circuit 518, to the Vss terminal 502, across the FER ESD protection device 506 (which is acting as a resistor), and to the I/O pad 508. In the reverse direction, an ESD event at the I/O pad 508 discharges to the Vdd terminal 501 using a rail-based discharge mechanism to shunt current from the I/O pad 508, across the FER ESD protection device 506 (which is acting as a resistor), to the Vss terminal 502, across the power clamp diode 517, and to the Vdd terminal 501. This ESD shunt circuit path from I/O to Vdd is workable because the PMOS transistor 511 stressed by the voltage build-up along this path is generally more robust than the counterpart NMOS transistor 521. For example, during an ESD discharge where 10V is applied to the I/O pad and shunted to the Vdd terminal 501, the voltage at the Vss terminal 502 is 9V (due to the voltage drop across the FER ESD protection device 506), the voltage at the anode of the power clamp diode 517 is 5V (due to the voltage drop from wire resistance), the voltage at the cathode of the power clamp diode 517 is 3V (due to the voltage drop across the power clamp diode 517), and the voltage at the Vdd terminal 501 is 0V (due to the voltage drop from wire resistance). In this example, during an ESD discharge where 10V is applied to the I/O pad and shunted to the Vdd terminal 501, the voltage at the Vdd terminal 501 is not powered to the 1V DC supply. As a result, its voltage depends on the discharge polarity. In the case where Vdd is at 0V, relative to the 10V at the pad, the PMOS transistor 511 sees a voltage from its "drain" to "source" about 6 to 9V (there are voltage drops on the wires due to wire resistance), whereas the NMOS transistor 521 sees a much smaller voltage drop (e.g., 0 to 4V). While the voltage drop of 6 to 9V across the PMOS transistor 511 would have damaged an NMOS transistor 521, the breakdown threshold of the PMOS transistor 511 is higher than an NMOS transistor 512, and can withstand this condition.

By now, it should be appreciated that there has been disclosed an electrostatic discharge protection device which uses a field effect resistor. As formed, the ESD device includes a semiconductor substrate of a first conductivity type. In the substrate, an anode region of a second conductivity type is formed and electrically coupled to a first pad, and a cathode region of the second conductivity type is also formed in the semiconductor substrate to be spaced apart from the anode region and electrically coupled to a second pad. In addition, a first well region of the second conductivity type is formed in the semiconductor substrate in series between the anode region and cathode region. Finally, first and second gate electrodes are disposed at least substantially overlying the first well region of the semiconductor substrate for creating first and second separate inversion layers of the first conductivity type in the first well region only when one or more bias voltages are applied to the first and second gate electrodes, and for shorting electrostatic discharge current between the anode region and cathode region and across the first well region if an electrostatic discharge event occurs at either the first or second pads. With this ESD device, the first and second separate inversion layers create a P/N/P/N/P structure in the first well region only when one or more bias voltages are applied to the first and second gate electrodes. In addition, by forming the first well region with a low threshold voltage well doping profile, the first and second separate inversion layers are maintained until a sufficiently large anode voltage is applied to the anode region to eliminate the first and second separate inversion layers. With this structure, the anode region, cathode region and well region behave as a P+/P/P+ resistor element in response to an electrostatic discharge event.

Although the described exemplary embodiments disclosed herein are directed to various semiconductor device structures and methods for making same, the present invention is not necessarily limited to the example embodiments which illustrate inventive aspects of the present invention that are applicable to a wide variety of semiconductor processes and/ or devices. Thus, the particular embodiments disclosed above are illustrative only and should not be taken as limitations upon the present invention, as the invention may be modified and practiced in different but equivalent manners apparent to those skilled in the art having the benefit of the teachings herein. For example, the select gate and floating gate layers may be defined with different shapes and relative dimensions than shown in the layout plot of FIG. 2. Moreover, the thickness of the described layers may deviate from the disclosed thickness values. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Although the described exemplary embodiments disclosed herein are directed to various electrostatic discharge protection devices, methods for making same and systems for protecting the input of semiconductor circuits, the present invention is not necessarily limited to the example embodiments which illustrate inventive aspects of the present invention that are applicable to a wide variety of semiconductor processes and/or devices. Because the particular embodiments disclosed above are illustrative only, it should be appreciated that a vast number of variations exist such that, for example, the thicknesses, materials, doping concentrations, and voltage range examples may deviate from the disclosed examples. In addition, the doping types of the various substrate regions (e.g., anode, cathode and well regions) could be reversed to form p-type inversions layers by applying a negative DC gate bias during normal operation to invert the n-type well in to p-type inversion layers, thereby forming a N/P/N/P/N structure. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

Accordingly, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

What is claimed is:

1. An electrostatic discharge protection device, comprising:
   a semiconductor substrate;
   a P+ anode region disposed within the semiconductor substrate;
   a first P-well device region disposed within the semiconductor substrate in series with the P+ anode region;
   a P+ cathode region disposed within the semiconductor substrate in series with the first P-well device region; and
   first and second field effect devices disposed at least substantially overlying the first P-well device region of the semiconductor substrate and arranged to create first and second separate n-type inversion layers in the first P-well device region only when one or more bias voltages are applied to the first and second field effect devices.

2. The electrostatic discharge protection device of claim 1, wherein the semiconductor substrate comprises a silicon layer formed over a buried insulator layer.

3. The electrostatic discharge protection device of claim 1, wherein the first P-well device region is doped to a concentration of about $1\times10^{16}$ to $\times10^{19}$ cm$^{-3}$ and the P+ anode region and the P+ cathode region are doped to a concentration of about $5\times10^{20}$ to about $5\times10^{21}$ cm$^{-3}$.

4. The electrostatic discharge protection device of claim 1, wherein the P+ anode region, first P-well device region, and P+ cathode region behave as a P+/P/P+ resistor element in response to the one or more bias voltages being decoupled or biased at substantially 0 V from the first and second field effect devices.

5. The electrostatic discharge protection device of claim 1, wherein the P+ anode region, first P-well device region, and P+ cathode region behave as a P+/P/P+ resistor element in response to an electrostatic discharge event.

6. The electrostatic discharge protection device of claim 1, wherein the first P-well device region has temporary separate n-type inversion layers formed in response to one or more bias voltages and behaves as a P/N/P/N/P structure in response to the one or more bias voltages being applied to the first and second field effect devices.

7. The electrostatic discharge protection device of claim 1, wherein the first and second field effect devices comprise first and second gate electrodes disposed at least substantially overlying the first P-well device region of the semiconductor substrate and arranged to create first and second separate n-type inversion layers in the first P-well device region in response to one or more bias voltages being applied to the first and second gate electrodes.

8. The electrostatic discharge protection device of claim 1, wherein the first and second field effect devices comprise a first n-type polysilicon gate electrode and a second p-type polysilicon gate electrode disposed at least substantially overlying the first P-well device region of the semiconductor substrate and arranged to create first and second separate n-type inversion layers in the first P-well device region in response to one or more bias voltages being applied to the first n-type polysilicon gate electrode and a second p-type polysilicon gate electrode.

9. An electrostatic discharge protection device, comprising:
   a semiconductor substrate of a first conductivity type;

an anode region of a second conductivity type formed in the semiconductor substrate and electrically coupled to a first pad;

a cathode region of the second conductivity type formed in the semiconductor substrate to be spaced apart from the anode region and electrically coupled to a second pad;

a first well region of the second conductivity type formed in the semiconductor substrate in series between the anode region and cathode region; and first and second gate electrodes disposed at least substantially overlying the first well region of the semiconductor substrate for creating first and second separate inversion layers of the first conductivity type in the first well region only when one or more bias voltages are applied to the first and second gate electrodes, and for shorting electrostatic discharge current between the anode region and cathode region and across the first well region if an electrostatic discharge event occurs at either the first or second pads.

10. The electrostatic discharge protection device of claim 9, where the first and second separate inversion layers create a P/N/P/N/P structure in the first well region only when one or more bias voltages are applied to the first and second gate electrodes.

11. The electrostatic discharge protection device of claim 9, where the first well region comprises a low threshold voltage well doping profile for ensuring that the first and second separate inversion layers are maintained until a sufficiently large anode voltage is applied to the anode region to eliminate the first and second separate inversion layers.

12. The electrostatic discharge protection device of claim 9, where the anode region, cathode region and well region behave as a P+/P/P+ resistor element in response to an electrostatic discharge event.

13. The electrostatic discharge protection device of claim 9, where the first and second gate electrodes comprise a first n-type polysilicon gate electrode and a second p-type polysilicon gate electrode.

* * * * *